(12) United States Patent
Usui et al.

(10) Patent No.: US 11,387,072 B2
(45) Date of Patent: Jul. 12, 2022

(54) CHARGED PARTICLE BEAM DEVICE

(71) Applicant: Hitachi High-Tech Corporation, Tokyo (JP)

(72) Inventors: Takahiro Usui, Tokyo (JP); Tatsuya Hirato, Tokyo (JP); Hiroyuki Chiba, Tokyo (JP); Yuki Suda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/279,713

(22) PCT Filed: Mar. 12, 2019

(86) PCT No.: PCT/JP2019/009897
§ 371 (c)(1),
(2) Date: Mar. 25, 2021

(87) PCT Pub. No.: WO2020/183596
PCT Pub. Date: Sep. 17, 2020

(65) Prior Publication Data
US 2022/0037108 A1 Feb. 3, 2022

(51) Int. Cl.
*H01J 37/22* (2006.01)
*H01J 37/20* (2006.01)

(52) U.S. Cl.
CPC ............ *H01J 37/22* (2013.01); *H01J 37/20* (2013.01); *H01J 2237/20214* (2013.01); *H01J 2237/20285* (2013.01)

(58) Field of Classification Search
CPC .. H01J 37/20; H01J 37/21; H01J 37/22; H01J 37/28; H01J 37/29; H01J 2237/216; H01J 2237/2002; H01J 2237/2482
See application file for complete search history.

(56) References Cited

U.S. PATENT DOCUMENTS 6,225,628 B1    5/2001  Iwabuchi et al.
2008/0315120 A1* 12/2008  Albiez .................... H01J 37/22
                                                    250/398

(Continued)

FOREIGN PATENT DOCUMENTS

JP     10-172490 A    6/1998
JP   2008-251407 A   10/2008

(Continued)

OTHER PUBLICATIONS

International Search Report (PCT/ISA/210) issued in PCT Application No. PCT/JP2019/009897 dated Jun. 11, 2019 with English translation (four (4) pages).

(Continued)

*Primary Examiner* — Wyatt A Stoffa
*Assistant Examiner* — Hsien C Tsai
(74) *Attorney, Agent, or Firm* — Crowell & Moring LLP

(57) ABSTRACT

Provided is a charged particle beam device using a detector that detects electromagnetic waves, in which a circumstance in a sample chamber can be checked, and a sample is observed with the detector at the same time. The charged particle beam device that observes a sample by using a charged particle beam, including: a component used for observing the sample; a detector that detects electromagnetic waves; a chamber scope that photographs a picture while irradiating the sample with the electromagnetic waves; and a control unit that controls the detector, the component, and an operation of the chamber scope, in which the control unit can be selectively operated in any one of a pre-photographing mode and an observation mode, the control unit causes the chamber scope to photograph the picture, in a state in which an operation of observing the sample by the detector is not performed in the pre-photographing mode, and the control unit, in the observation mode, does not cause the (Continued)

chamber scope to apply the electromagnetic waves, generates a guide image showing a positional relationship between the sample and the component based on the picture, and outputs the guide image.

6 Claims, 7 Drawing Sheets

(56) References Cited

U.S. PATENT DOCUMENTS

2011/0291010 A1  12/2011  Katane et al.
2019/0148105 A1   5/2019  Koyanagi et al.

FOREIGN PATENT DOCUMENTS

| JP | 2009-525571 A | 7/2009 | |
|---|---|---|---|
| JP | 2013-225530 A | 10/2013 | |
| JP | 2014-93283 A | 5/2014 | |
| WO | WO 2016/088260 A1 | 6/2016 | |
| WO | WO-2016088260 A1 * | 6/2016 | ............ G01B 11/00 |
| WO | WO 2017/216941 A1 | 12/2017 | |

OTHER PUBLICATIONS

Japanese-language Written Opinion (PCT/ISA/237) issued in PCT Application No. PCT/JP2019/009897 dated Jun. 11, 2019 (three (3) pages).

* cited by examiner

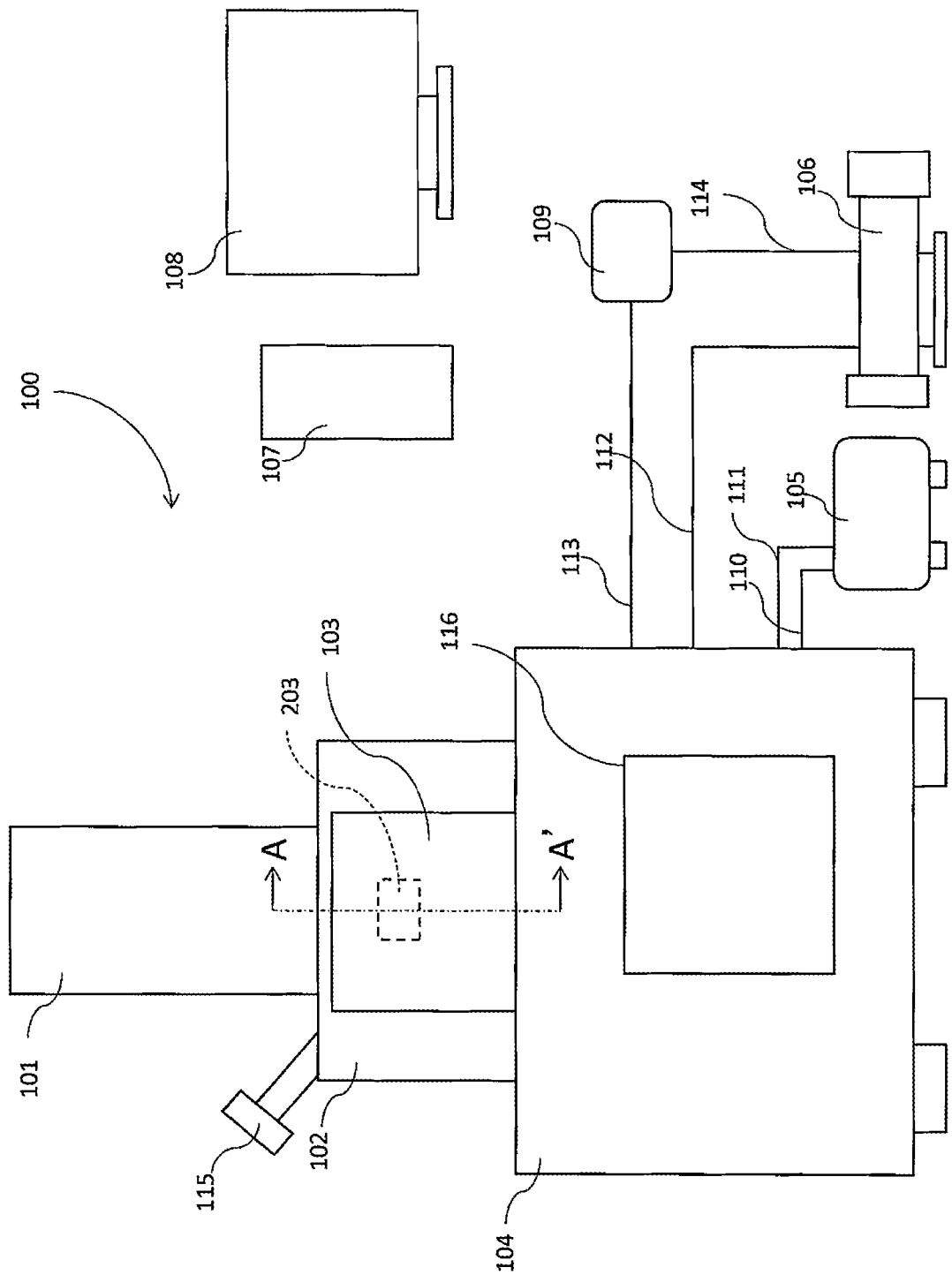

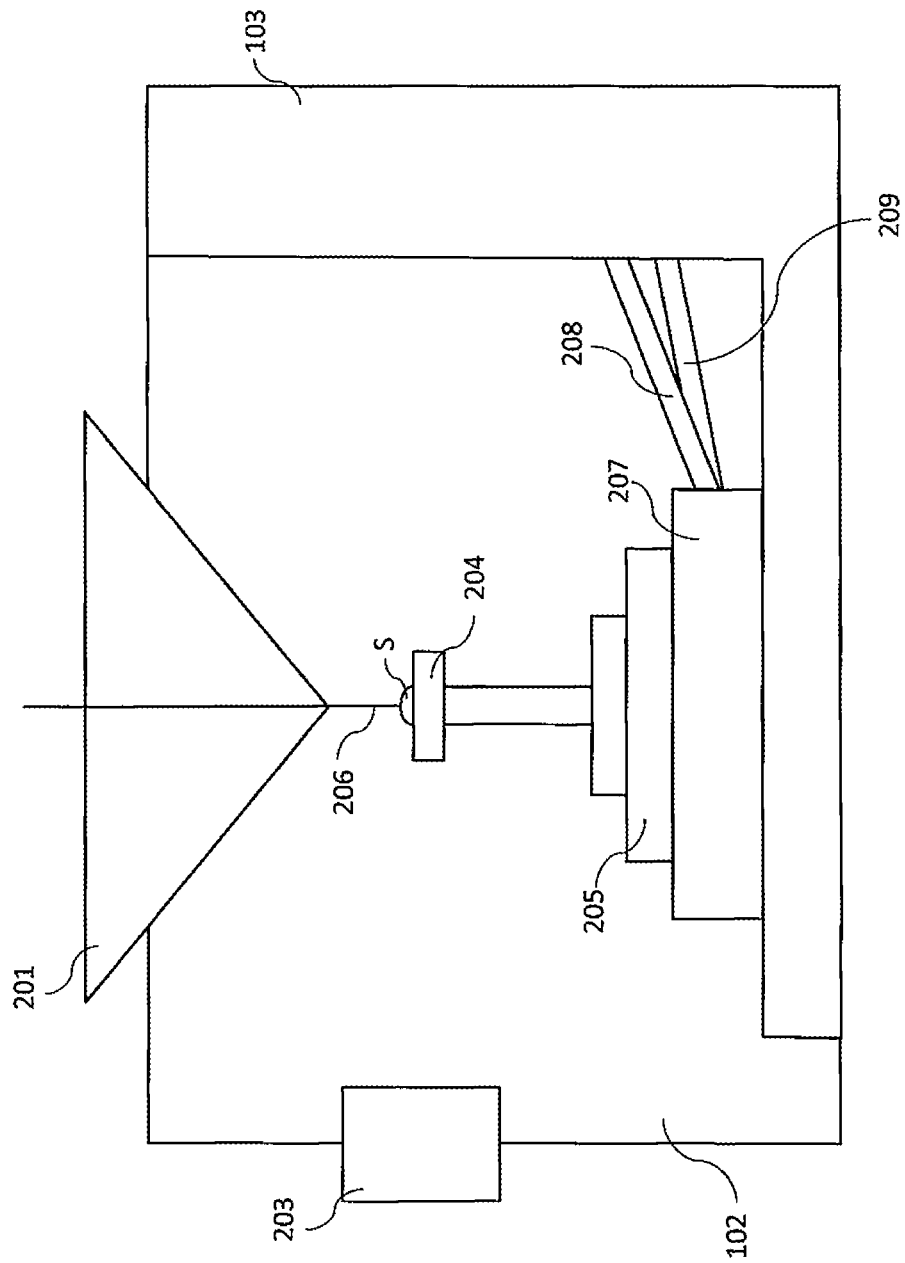
[FIG. 2]

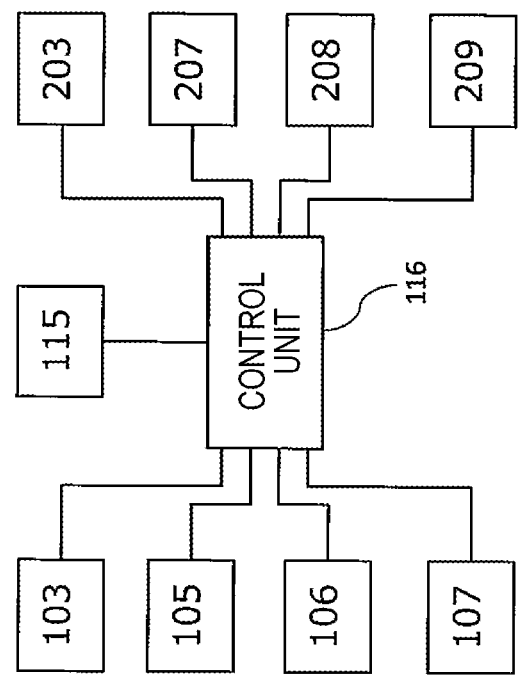
[FIG. 3]

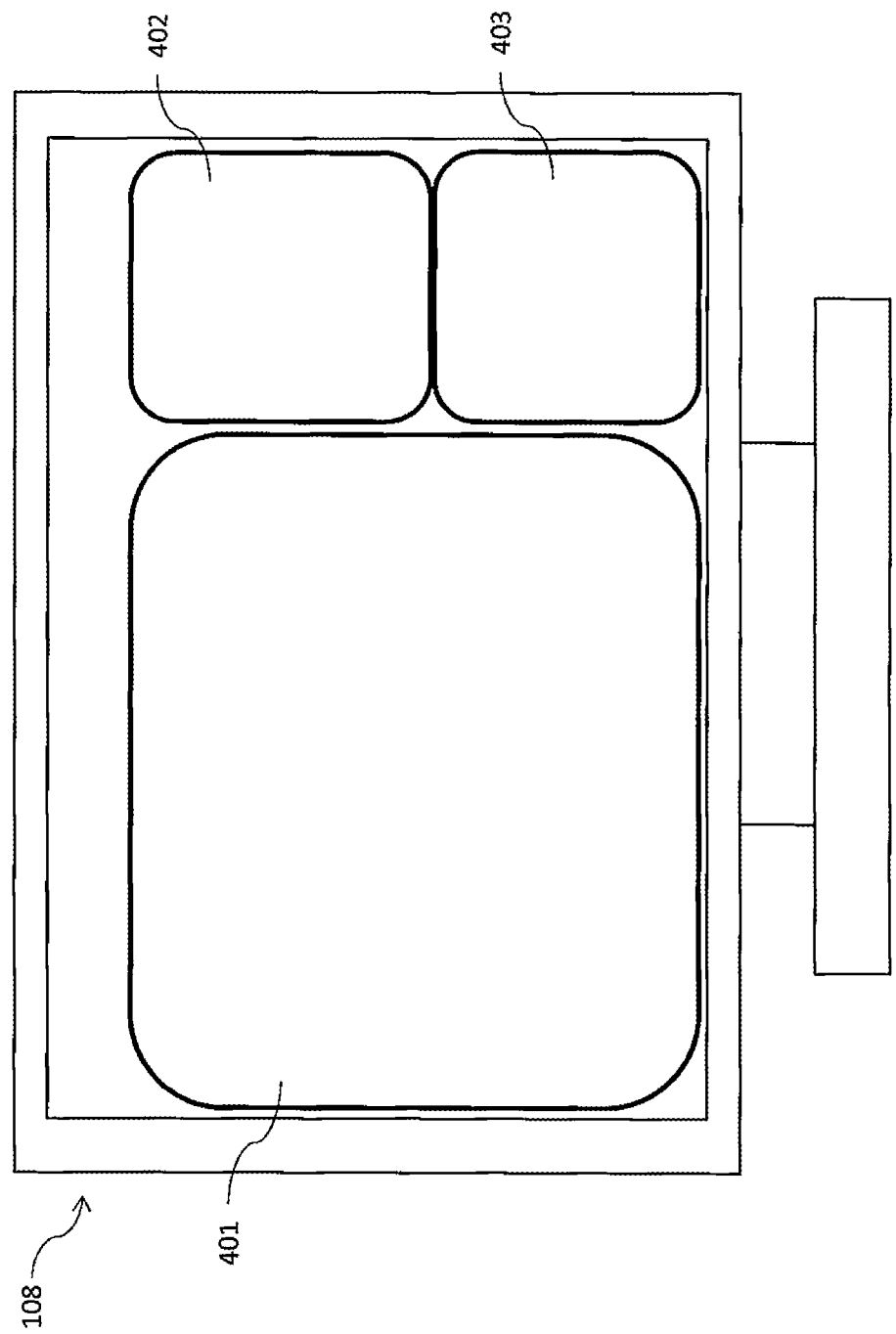
[FIG. 4]

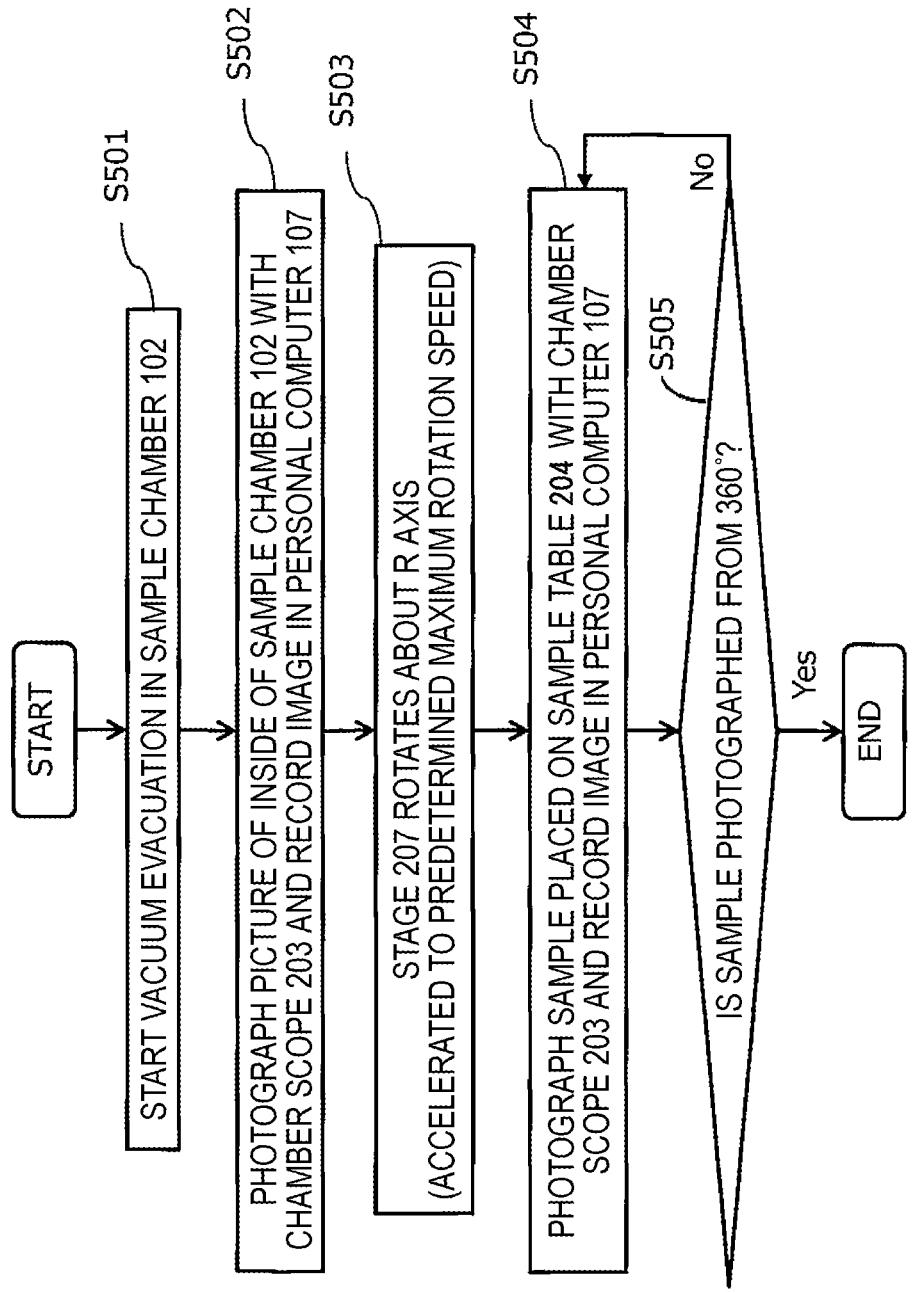

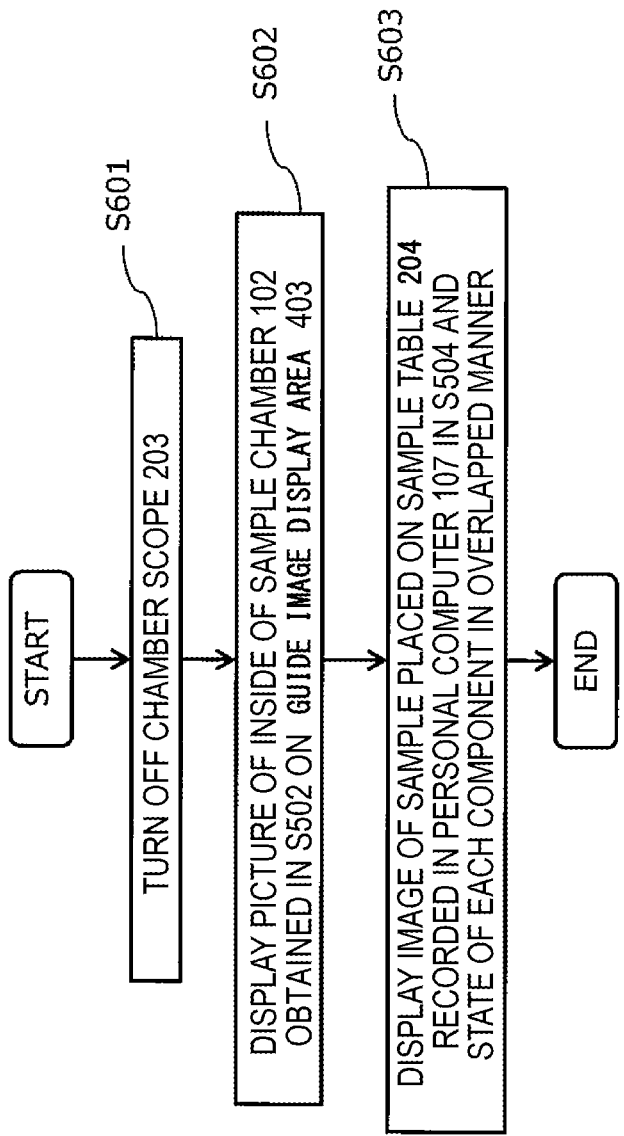

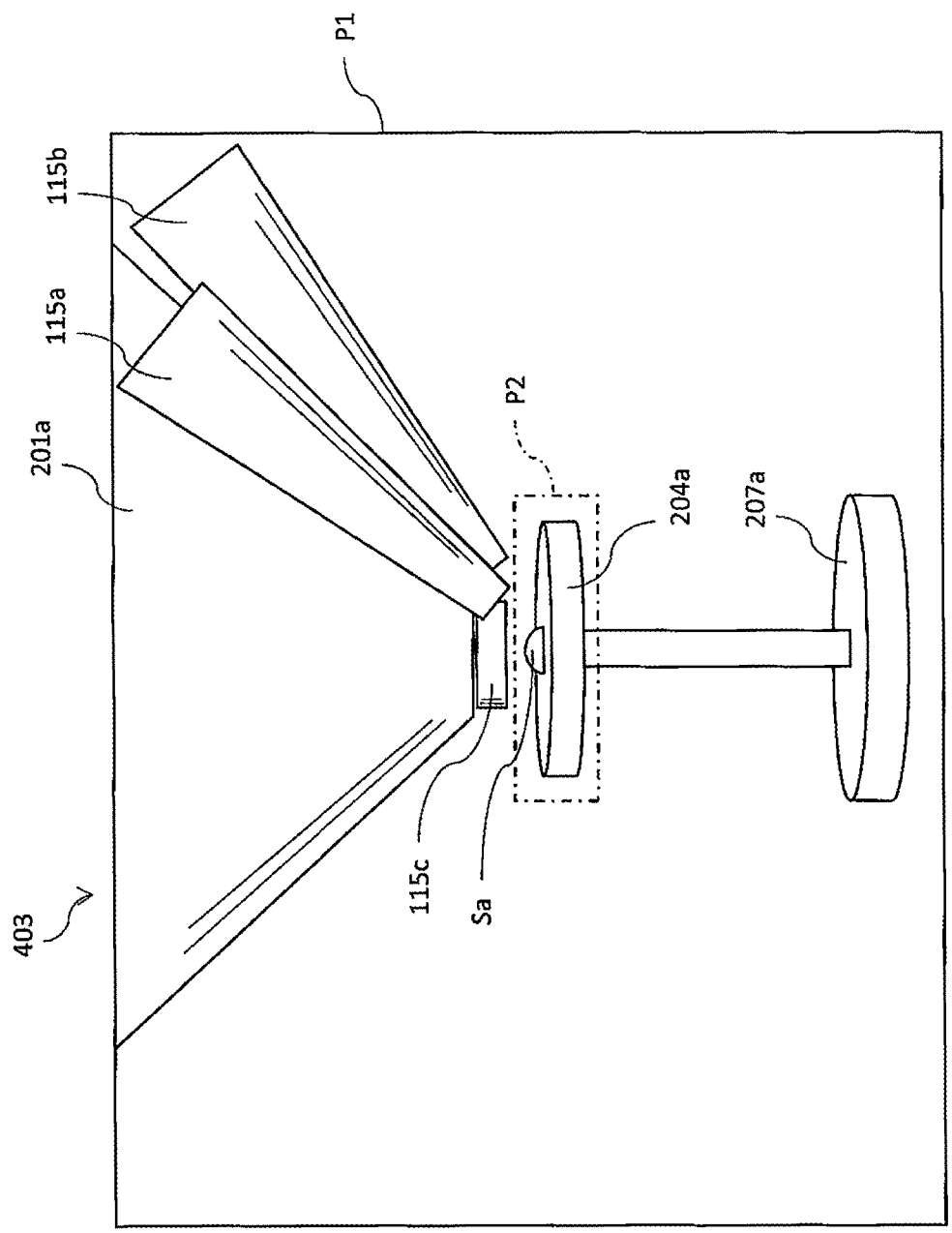
[FIG. 7]

CHARGED PARTICLE BEAM DEVICE

TECHNICAL FIELD

The present invention relates to a charged particle beam device and particularly to a device that observes a sample with a charged particle beam.

BACKGROUND ART

The charged particle beam device that observes a sample with a charged particle beam includes a device that detects electromagnetic waves. JP-A-H10-172490 (1998) (PTL 1) discloses an example of such a charged particle beam device.

Particularly, examples of the detector for detecting electromagnetic waves for observation include an ultra variable-pressure detector (UVD, highly sensitive low rough vacuum detector) that detects excitation light generated when secondary electrons ionize residual gas molecules, an energy dispersive X-ray spectrometry (EDS) detector that detects x rays generated by electron collision, and a back scattered electron detector (BSE, reflected electron detector) that indirectly detects reflected electrons by detecting electromagnetic waves. JP-A-2013-225530 (PTL 2) discloses an example of the configuration of a UVD.

In addition, there is a charged particle beam device which includes a chamber scope that irradiates the inside of the sample chamber with visible light. The user of the charged particle beam device can move the component of the device, while checking the inside of the sample chamber with the chamber scope. WO-A-2017/216941 (PTL 3) discloses an example of such a charged particle beam device.

CITATION LIST

Patent Literature

PTL 1: JP-A-H10-172490 (1998)
PTL 2: JP-A-2013-225530
PTL 3: WO-A-2017/216941

SUMMARY OF INVENTION

Technical Problem

An object of the chamber scope is mainly to apply visible light in many cases, but wavelengths other than the visible light cannot be completely suppressed. Therefore, in a case where a detector of the type that observes the sample with electromagnetic waves is used, it is likely that a noise is generated by the chamber scope. In order to avoid such a noise, the use of the chamber scope is limited to a stage before starting the observation of the sample.

In this manner, in the charged particle beam device using the detector that detects the electromagnetic wave, there is a problem that the circumstance checking of the inside of the sample chamber and the observation of the sample with the detector cannot be performed at the same time.

It is likely that this problem leads to various harmful effects. For example, if the circumstance inside the sample chamber cannot be checked during the sample observation, the operation of the component in the sample chamber is not appropriately performed. As a specific example, an objective lens may be brought too close to the sample to come into contact with the sample, so that the objective lens is damaged.

The present invention is conceived to solve such a problem and is to provide a charged particle beam device using a detector that detects electromagnetic waves, in which the circumstance inside the sample chamber can be checked and the sample can be observed with the detector at the same time.

Solution to Problem

According to the present invention, a charged particle beam device that observes a sample by using a charged particle beam, includes a component used for observing the sample; a detector that detects electromagnetic waves; a chamber scope that photographs a picture while irradiating the sample with the electromagnetic waves; and a control unit that controls the detector, the component, and an operation of the chamber scope, in which the control unit can be selectively operated in any one of a pre-photographing mode and an observation mode, the control unit causes the chamber scope to photograph the picture, in a state in which an operation of observing the sample by the detector is not performed in the pre-photographing mode, and the control unit, in the observation mode, does not cause the chamber scope to apply the electromagnetic waves, generates a guide image showing a positional relationship between the sample and the component based on the picture, and outputs the guide image.

Advantageous Effects of Invention

In a charged particle beam device according to the present invention, a picture is photographed by a chamber scope in advance and generates a guide image showing a positional relationship between a sample and a component based on the picture during the observation, and thus the circumstance checking of the inside of the sample chamber and the observation of the sample with the detector can be performed at the same time.

BRIEF DESCRIPTION OF DRAWINGS

FIG. 1 is a diagram illustrating a configuration of a charged particle beam device according to a first embodiment of the present invention.

FIG. 2 is a partial cross-sectional view taken along the line A-A' of FIG. 1.

FIG. 3 is a block diagram illustrating an example of a functional configuration relating to control of a scanning electron microscope of FIG. 1.

FIG. 4 illustrates a more specific configuration example of a display device of FIG. 1.

FIG. 5 is a flowchart illustrating a flow of an operation of the scanning electron microscope in a pre-photographing mode.

FIG. 6 is a flowchart illustrating a flow of an operation of the scanning electron microscope in an observation mode.

FIG. 7 is a diagram illustrating a configuration example of a guide image.

DESCRIPTION OF EMBODIMENTS

Hereinafter, an embodiment of the present invention is described with reference to the drawings.

Example 1

FIG. 1 illustrates a configuration example of a charged particle beam device according to a first embodiment of the present invention. In Example 1, a charged particle beam device is configured as a scanning electron microscope 100, but the present invention can be applied to other charged particle beam devices in the same manner. The scanning electron microscope 100 is a device for observation of a sample with a charged particle beam.

The scanning electron microscope 100 includes a lens barrel 101, a sample chamber 102, a stage unit 103, a gantry 104, a compressor 105, a rotary pump 106, a personal computer 107, a display device 108, a weight 109, a compressor power cable 110, an air pressure adjusting tube 111, a rotary pump power cable 112, a flexible pipe 113, a flexible pipe 114, a detector 115, and a control unit 116.

The lens barrel 101 is a structure for guiding charged particle beams emitted from an electron gun or the like. The sample chamber 102 is a space where a sample to be observed is placed. The stage unit 103 is a structure for movably fixing the sample. The gantry 104 is a pedestal to which the sample chamber 102 is fixed.

The compressor 105, the rotary pump 106, the weight 109, the compressor power cable 110, the air pressure adjusting tube 111, the rotary pump power cable 112, the flexible pipe 113, and the flexible pipe 114 configure a mechanism for causing the sample chamber 102 in a low rough vacuum.

The rotary pump 106 is a vacuum pump for evacuating the air in the sample chamber 102. The rotary pump 106 is supplied with electric power via the rotary pump power cable 112 and is controlled by using the weight 109. The weight 109 is connected to the gantry 104 and the rotary pump 106 via the flexible pipe 113 and the flexible pipe 114, respectively.

The compressor 105 is supplied with electric power via the compressor power cable 110, and sends out the compressed air for opening and closing the valve of the rotary pump 106. The compressed air is sent out via the air pressure adjusting tube 111.

The personal computer 107 is a computer including calculation means (for example, a CPU) and storage means (for example, a storage medium such as a semiconductor storage device and a magnetic disk device), and functions as an interface between the scanning electron microscope 100 and a user. A program that regulates an operation of the personal computer 107 is stored in the storage means of the personal computer 107, and the calculation means of the personal computer 107 realizes the function as the personal computer 107 described in the present specification by executing the program.

The display device 108 is a device that displays the information relating to the scanning electron microscope 100. The display device 108 may be a display device connected to the personal computer 107.

The detector 115 is a device that detects electromagnetic waves. A sample S is observed based on the electromagnetic waves detected by the detector 115. As the detector 115, any type of detector may be used, as long as the detector detects electromagnetic waves. For example, the detector may be UVD disclosed in JP-A-2013-225530 or the like or may be an EDS detector or BSE. A specific configuration of the detector 115 can be appropriately designed by those skilled in the art based on JP-A-2013-225530 or other known techniques.

The control unit 116 controls an operation of the scanning electron microscope 100. The control unit 116 may include a microcomputer including the calculation means and the storage means. A program that regulates the operation of the control unit 116 may be stored in the storage means of the microcomputer. The calculation means of the microcomputer may realize the function as the control unit 116 described in the present specification by executing the program.

FIG. 2 is a partial cross-sectional view taken along the line A-A' of FIG. 1. With respect to the sample chamber 102, the stage unit 103, an objective lens 201, a chamber scope 203, a sample table 204, a sample platform 205, a stage 207, an X-axis spline 208, and a Y-axis spline 209 are placed.

The objective lens 201 is a lens for converging a charged particle beam 206 on a specific scanning portion of the sample S. The sample table 204 is a structure for supporting or fixing the sample S. The sample platform 205 is a structure for supporting or fixing the sample table 204. The stage 207 is a structure for supporting or fixing the sample platform 205. The stage 207 is rotatably configured and can rotate the sample S. The X-axis spline 208 and the Y-axis spline 209 are connecting components for moving the stage 207 or changing the posture of the stage 207.

The scanning electron microscope 100 uses various components described above for observing the sample S. Examples of the components used for observation include the detector 115, the objective lens 201, the sample table 204, the sample platform 205, the stage 207, the X-axis spline 208, and the Y-axis spline 209. These components are examples of configuration elements of the scanning electron microscope 100.

The chamber scope 203 is a device that irradiates the sample S with the electromagnetic waves and photographs a picture. In the present example, the chamber scope 203 photographs a picture with visible light. The chamber scope 203 includes, for example, a white LED. Therefore, the chamber scope 203 mainly applies visible light, but wavelengths other than the visible light (for example, ultraviolet rays and X rays) may not be completely suppressed. Also, visible light or light of other wavelengths emitted by the chamber scope 203 may be detected as a noise by the detector 115.

The chamber scope 203 photographs, for example, a picture of the inside of the sample chamber 102. This picture includes various components described above in view. The picture is photographed in a state in which the sample S is placed in the sample chamber 102 (more specifically, for example, on the sample table 204). Specific photographing processes are described below with reference to FIG. 5.

FIG. 3 is a block diagram illustrating an example of a functional configuration relating to control of the scanning electron microscope 100. The control unit 116 is connected to the configuration elements or components of the scanning electron microscope 100 (the stage unit 103, the compressor 105, the rotary pump 106, the personal computer 107, the detector 115, the chamber scope 203, the stage 207, the X-axis spline 208, the Y-axis spline 209, and the like) so that communication can be performed or operations of these can be controlled. The control unit 116 transmits or receives the information to and from these configuration elements and components to control the operations of each of the configuration elements or the components so that the entire operations of the scanning electron microscope 100 are controlled.

FIG. 4 illustrates a more specific configuration example of the display device 108. The display device 108 can display an observation image display area 401, an image adjusting item area 402, and a guide image display area 403. These areas are displayed, for example, according to the control of the personal computer 107.

The observation result of the sample S is displayed on the observation image display area 401. An image configured, for example, based on the data detected by the detector 115 is displayed. A graphical user interface (GUI) for controlling the scanning electron microscope 100 is displayed in the image adjusting item area 402. The user of the scanning electron microscope 100 can control the operation of the scanning electron microscope 100 by performing operation input on the GUI. A guide image based on the picture photographed by the chamber scope 203 is displayed on the guide image display area 403. Details of the guide image are described below with reference to FIG. 7.

The operations of the scanning electron microscope 100 configured as above are described below.

The scanning electron microscope 100 is configured so as to be capable of being operated according to anyone of a plurality of operation modes. The operation mode includes an observation mode for observing the sample S by using the detector 115 and a pre-photographing mode for photographing a picture of a sample with the chamber scope 203 before the observation. The scanning electron microscope 100 can be selectively operated in at least any one of the two modes.

The operation in each mode is controlled, for example, by the control unit 116 and realized by the control unit 116 operating each configuration element or each component. It is not required that all of the operations of each mode automatically proceed, and the control unit 116 may require an instruction or an operation from the user during the operations of each mode when causing the process to proceed.

FIG. 5 is a flowchart illustrating a flow of an operation of the scanning electron microscope 100 in the pre-photographing mode. The execution of the process of FIG. 5 starts according to the input of the instruction from the user for starting the operation of the pre-photographing mode. The user, for example, places the sample S on the sample table 204 and inputs the instruction for starting the operation of the pre-photographing mode in a state in which the sample table 204 is set on the sample platform 205.

In the pre-photographing mode, first, the rotary pump 106 starts evacuation for forming a vacuum in the sample chamber 102 (Step S501). Subsequently, the chamber scope 203 photographs a picture in the sample chamber 102 (Step S502). The direction of the optical axis of the photography can be arbitrarily designed, and may be for example, the direction orthogonal to the axis of the charged particle beam 206.

If Step S502 is executed immediately after the execution of Step S501 (that is, during the exhaustion operation or before the air pressure in the sample chamber 102 is sufficiently decreased), the entire processing time can be shortened. However, Step S502 may be executed after the exhaustion operation is completed, or the air pressure in the sample chamber 102 is sufficiently decreased.

The picture photographed in Step S502 is converted into a predetermined image format (for example, a well-known JPG format) and transmitted to the personal computer 107. The personal computer 107 receives the picture and stores the picture in the storage means. The personal computer 107 may display the received picture on the guide image display area 403 of the display device 108.

Subsequently, the stage 207 rotates about the R axis (Step S503). Here, the stage 207 is accelerated to a predetermined maximum rotation speed.

In a state in which the stage 207 rotates, the chamber scope 203 photographs a picture of the sample S (Step S504). The photograph target is a space including the sample S, and may include components placed in the sample chamber 102. These components include, for example, the objective lens 201, the sample table 204, and the stage 207. These components may include the detector 115. The direction of the optical axis of the photography can be arbitrarily designed, and may be, for example, a direction orthogonal to the axis of the charged particle beam 206.

The picture photographed in Step S504 is converted into a predetermined image format (for example, a well-known JPG format) and transmitted to the personal computer 107. The personal computer 107 receives the picture and stores the picture in the storage means. The personal computer 107 may display the received picture in the guide image display area 403 of the display device 108.

After the photography, it is determined whether the chamber scope 203 photographs pictures from all directions of the sample S (that is, in the entire range of 360°) (Step S505). If there is an orientation where the photography is not completed, Step S504 is repeated, and if the photography is completed from all orientations, the process of FIG. 5 ends.

The angle interval of the photography can be appropriately designed. The photography may be performed, for example, from four orientations (an interval of 90°), 16 orientations (an interval of 22.5°), or 360 orientation (an interval of 1°). In this manner, each picture is photographed from the plurality of rotation orientations of the sample S, and as a result, a plurality of pictures are formed.

In the pre-photographing mode, the operation of the detector 115 can be suppressed. For example, in the pre-photographing mode, the detector 115 does not detect the electromagnetic wave, and thus the sample S is not observed. Therefore, even if the chamber scope 203 operates, the noise thereof does not influence on the observation by the detector 115. Therefore, the control unit 116 of the scanning electron microscope 100 may execute the process of stopping the operation of the observation of the sample S by the detector 115 before Step S502. Accordingly, in the pre-photographing mode, the scanning electron microscope 100 can be in a state of not performing the operation of the observation of the sample S by the detector 115.

FIG. 6 is a flowchart illustrating a flow of the operation of the scanning electron microscope 100 in the observation mode. The execution of the process of FIG. 6 starts in response to an input of the instruction for starting the operation of the observation mode. The user inputs the instruction for starting the operation of the observation mode, for example, in a state in which the process is completed in the pre-photographing mode.

In the observation mode, first, the operation of the chamber scope 203 stops (Step S601). That is, in the observation mode, the chamber scope 203 does not apply the electromagnetic waves. Therefore, a situation in which the noise due to the application of the electromagnetic waves for photography by the chamber scope 203 influences on the observation by the detector 115 is avoided.

Subsequently, the display device 108 displays the picture in the sample chamber 102 on the guide image display area 403 (Step S602). The picture is the picture photographed in Step S502. As a specific process, the personal computer 107 obtains an image (an image showing the picture) stored in the storage means and causes the display device 108 to display the image.

Subsequently, the display device 108 displays the picture of the sample S on the guide image display area 403 (Step S603). The picture is a picture photographed in Step S504. As a specific process, the personal computer 107 obtains the image (an image showing the picture) stored in the storage means and causes the display device 108 to display the image.

Here, the picture of the sample S is displayed according to the state of each component of the scanning electron microscope 100. For example, if the picture of the sample S is stored with respect to the plurality of orientations, the control unit 116 or the personal computer 107 selects most suitable for the state (for example, the orientation) of the stage 207 at that time. In that case, for example, a picture of which the difference between the orientation in which the picture is photographed in Step S504 and the orientation at the time of execution of Step S603 is the smallest is selected.

In Step S603, the scanning electron microscope 100 displays images of each component on the picture of the inside of the sample chamber 102 and the picture of the sample S in an overlapped manner.

FIG. 7 illustrates an example of a display content of the guide image display area 403 after the execution of Step S603. The picture of the inside of the sample chamber 102 displayed in Step S602 and the picture of the sample S displayed in Step S603 are displayed in an overlapped manner.

For convenience of explanation, the picture of the inside of the sample chamber 102 displayed in Step S602 is referred to as an entire picture P1, and the picture of the sample S displayed in Step S603 is referred to as a sample picture P2. The position where the sample picture P2 is overlapped is designed so that the positions of the sample S in the entire picture P1 and the sample picture P2 are identical to each other. These positions can be appropriately determined by those skilled in the art based on the configuration of the scanning electron microscope 100, the position of the chamber scope 203, and the like.

The sample picture P2 includes an image Sa of the sample S. In addition, with respect to one or more of various components of the scanning electron microscope 100, the entire picture P1 and the sample picture P2 may include an image showing the component. For example, in the example of FIG. 7, the sample picture P2 includes an image 204a of the sample table 204. The entire picture P1 includes images of the detector 115 (an image 115a of a secondary electron detector, an image 115b of an EDS detector, an image 115c of BSE, and the like), an image 201a of the objective lens 201, and an image 207a of the stage 207.

Here, the image Sa of the sample S is an image by the picture (the sample picture P2) photographed in the processes of FIG. 5, but the other images (the images 115a, 115b, 115c, 201a, 204a, and 207a) are not required to be the pictures photographed in the processes of FIG. 5, and may be images prepared in advance. The images prepared in advance may be pictures photographed in a process before FIG. 5, may be so-called computer graphics image, may be an image geometrically drawn on two-dimensional coordinates, or may be an image geometrically drawn on pseudo three-dimensional coordinates.

As images other than the images of the sample S, common images regardless of the sample S can be used, and can be stored in the storage means of the control unit 116 or in the storage means of the personal computer 107, in advance. The positions where the images other than the images of the sample S are displayed can be appropriately determined by those skilled in the art based on the configuration of the scanning electron microscope 100, the positions of each corresponding component, and the like.

In this manner, the control unit 116 generates a guide image as illustrated in FIG. 7 appropriately overlapping the image showing the component based on the entire picture P1 and the sample picture P2. The guide image generated in this manner can be an image showing a positional relationship between the sample S and each component. The control unit 116 outputs this guide image. The output is performed to the personal computer 107, and finally the display device 108 receives the guide image and displays the guide image on the guide image display area 403.

Though not particularly illustrated in FIGS. 6 and 7, the operation of the scanning electron microscope 100 in the observation mode can be designed in the same manner as the operation when the well-known scanning electron microscope observes the sample. For example, in the observation mode, the detector 115 can observe the sample S by detecting electromagnetic waves generated as a result of the irradiation of the sample S with the charged particle beam 206. The control unit 116 generates the observation image of the sample S based on the output of the detector 115. The observation image may be displayed on the observation image display area 401 of the display device 108 or may be output to other output devices.

The operation relating to the observation of the sample S can be designed to be executed based on the well-known operation or the like, after the completion of the process of FIG. 6 or during the execution of the process of FIG. 6, at an arbitrarily timing. Particularly, by executing the observation process after Step S601, the user can avoid a noise by the chamber scope 203.

A guide image showing the positional relationship between the sample S and each component is displayed on the guide image display area 403, and the guide image display area 403 is configured as a display area different from the observation image display area 401, and thus the user can check the guide image based on the picture by the visible light, even during the observation work using the detector 115.

Particularly, in the present example, the guide image is configured so that the image showing the component is overlapped with the entire picture P1 photographed by the chamber scope 203, and even during the observation of the sample S, that is, when the chamber scope 203 cannot be used, the user can check the position likewise where the chamber scope 203 can be used.

In this manner, according to the scanning electron microscope 100 relating to Example 1 of the present invention, the circumstance in the sample chamber 102 can be checked, and the sample S can be observed with the detector 115, at the same time.

In Example 1, a modification as below can be performed.

In Step S603 of Example 1, the user may be able to move the components. For example, the scanning electron microscope 100 may include an operation unit that receives an operation input for moving each component. Such an operation unit can be configured by using a GUI displayed, for example, on the image adjusting item area 402. Then, the control unit 116 may move each component according to the operation input.

In such a case, according to the movement of each component, display positions of the images of each component may be changed. More specifically, the positions where the images of each component are displayed in the guide image may be determined according to the actual positions of each component. In other words, the guide image may be generated based on the positions of each component. For example, if the user performs an operation of bringing the objective lens 201 closer to the sample S with the operation unit, the image 201a of the objective lens 201 may be brought closer to the image Sa of the sample S on the guide image according to the movement amount of the objective lens 201.

In this manner, an inappropriate operation by the user can be prevented. In the configuration in the related art, it is likely that the user operates the objective lens while only looking at the observation image carelessly, to cause an accident of erroneously bringing the objective lens into contact with the sample. However, according to the modification example of Example 1, the positional relationship between the objective lens 201 and the sample S is displayed on the guide image display area 403, and thus the positional relationship changes according to the movement of the objective lens 201. Therefore, the user can easily recognize the positional relationship, and thus the accident due to the carelessness of the user can be suppressed.

Such dynamic display of the positional relationship is also possible for components other than the objective lens 201. For example, if the same process is executed with respect to the operation of the stage 207, the height position, the inclination, the left and right position, the front and back position, or the like of the stage 207 is obtained, and a guide image reflecting these is displayed.

The control unit 116 may select the entire picture P1 or the sample picture P2 (or the both) included in the guide image according to the operation input. For example, if the pictures from a plurality of orientations is photographed in Step S504, one picture corresponding to the state most consistent with the operation input can be selected as the sample picture P2 from these pictures.

Here, those skilled in the art can appropriately design the criteria for selecting the "picture corresponding to the state most consistent with the operation input". For example, if the user performs an operation of rotating the stage 207 via the operation unit as the operation input, a picture photographed in the orientation closest to the actual orientation of the stage 207 can be selected.

According to the modification example, in a case where the information that can be observed changes according to the orientation of the sample S, the sample S can be observed more effectively. For example, if there is unevenness in the sample S, according to the orientation in which the sample S is placed, a portion of the structure of the sample S is shielded by other portions, so that sufficient observation data may not be obtained. Also in such a case, according to the modification example, the sample S can be rotated to an orientation in which the influence by shielding becomes minimum, and the observation can be performed there. In the course of the rotation operation, the specific observation operation is unnecessary, and the user may rotate the stage 207 while simply looking at the guide image display area 403, so that it is easy to rotate the sample S to an appropriate orientation.

In Example 1, both of the entire picture P1 and the sample picture P2 are used for the guide image, but any one of the both may be used. Particularly, in the example of FIG. 7, the size of the sample picture P2 is smaller than that of the entire picture P1, but if the sample picture P2 is photographed in the same size of the entire picture P1 of FIG. 7, it is not required to use the entire picture P1.

The embodiment may be modified so that the sample picture P2 is not used. In this case, Steps S503 to S505 can be omitted. Such a modification example is effective in the configuration where the stage 207 does not rotate or in a case where a sample that is not influenced by the rotation of the stage 207 is observed.

In Example 1, the control unit 116 and the personal computer 107 are configured as computers configured with different hardware, respectively, but the configuration unit of the hardware may be arbitrarily changed. For example, the entire functions of the control unit 116 and the personal computer 107 may be installed in a single computer, or the functions of the control unit 116 and the personal computer 107 may be further distributed to a plurality of computers.

REFERENCE SIGNS LIST

100: scanning electron microscope (charged particle beam device)
101: lens barrel
102: sample chamber
103: stage unit
104: gantry
105: compressor
106: rotary pump
107: personal computer
108: display device
109: weight
110: compressor power cable
111: air pressure adjusting tube
112: rotary pump power cable
113, 114: flexible pipe
115: detector (component)
115*a*, 115*b*, 115*c*: image
116: control unit
201: objective lens (component)
201*a*: image
203: chamber scope
204: sample table (component)
204*a*: image
205: sample platform (component)
206: charged particle beam
207: stage (component)
207*a*: image
208: X-axis spline (component)
209: Y-axis spline (component)
401: observation image display area
402: image adjusting item area (operation unit)
403: guide image display area
S: the sample
Sa: image
P1: entire picture (picture)
P2: sample picture (picture)

The invention claimed is:

1. A charged particle beam device that observes a sample by using a charged particle beam, comprising:
   a component used for observing the sample;
   a detector that detects electromagnetic waves;
   a chamber scope that photographs a picture while irradiating the sample with the electromagnetic waves; and
   a control unit that controls the detector, the component, and an operation of the chamber scope,
   wherein the control unit can be selectively operated in any one of a pre-photographing mode and an observation mode,
   the control unit causes the chamber scope to photograph the picture, in a state in which an operation of observing the sample by the detector is not performed in the pre-photographing mode, and
   the control unit, in the observation mode,
   does not cause the chamber scope to apply the electromagnetic waves, generates a guide image showing a positional relationship between the sample and the component based on the picture, and outputs the guide image.

2. The charged particle beam device according to claim 1, wherein the guide image is an image obtained by overlapping an image showing the component with the picture.

3. The charged particle beam device according to claim 1, further comprising:

an operation unit that receives an operation input for moving the component, wherein the control unit moves the component according to the operation input in the observation mode, and the guide image is further generated based on a position of the component.

4. The charged particle beam device according to claim 1, further comprising:

an operation unit that receives an operation input for moving the component, wherein the component includes a stage that rotates the sample, the picture includes a plurality of pictures photographed in a plurality of rotation orientations of the sample, the control unit selects one of the pictures according to the operation input in the observation mode, and the guide image is generated based on the selected picture.

5. The charged particle beam device according to claim 1, wherein the control unit, in the observation mode, further causes the detector to detect an electromagnetic wave generated according to a result of irradiating the sample with the charged particle beams, and generates an observation image based on an output of the detector.

6. The charged particle beam device according to claim 1, further comprising:

a display device that receives and displays the guide image.

* * * * *